United States Patent
Dell et al.

(10) Patent No.: US 9,043,569 B2
(45) Date of Patent: May 26, 2015

(54) MEMORY DATA MANAGEMENT

(71) Applicant: International Business Machines Corporation, Armonk, NY (US)

(72) Inventors: Timothy J. Dell, Colchester, VT (US); Manoj Dusanapudi, Bangalore (IN); Prasanna Jayaraman, Bangalore (IN); Anil B. Lingambudi, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 13/906,691

(22) Filed: May 31, 2013

(65) Prior Publication Data

US 2014/0359241 A1    Dec. 4, 2014

(51) Int. Cl.
  G06F 12/00  (2006.01)
  G06F 12/02  (2006.01)
  G06F 3/06   (2006.01)

(52) U.S. Cl.
  CPC .............. *G06F 12/02* (2013.01); *G06F 3/0647* (2013.01); *G06F 3/0625* (2013.01)

(58) Field of Classification Search
  CPC ...... G06F 12/02; G06F 3/0625; G06F 3/0647
  See application file for complete search history.

(56) References Cited

U.S. PATENT DOCUMENTS

| | | | |
|---|---|---|---|
| 7,272,734 B2 | 9/2007 | Gooding | |
| 7,496,711 B2 | 2/2009 | Bartley et al. | |
| 7,707,379 B2 | 4/2010 | Bartley et al. | |
| 7,761,678 B1 * | 7/2010 | Bodmer et al. | 711/165 |
| 8,108,609 B2 | 1/2012 | Barth et al. | |
| 8,255,628 B2 | 8/2012 | Bartley et al. | |
| 8,340,953 B2 | 12/2012 | Rajan et al. | |
| 2003/0028711 A1 * | 2/2003 | Woo et al. | 711/106 |
| 2007/0050549 A1 | 3/2007 | Verdun | |
| 2009/0100214 A1 * | 4/2009 | Chen et al. | 711/103 |
| 2009/0307409 A1 | 12/2009 | Rogers et al. | |
| 2010/0017632 A1 * | 1/2010 | Cooper et al. | 713/320 |
| 2010/0082995 A1 | 4/2010 | Dees et al. | |
| 2011/0161555 A1 | 6/2011 | Olds et al. | |
| 2011/0252180 A1 | 10/2011 | Hendry et al. | |
| 2011/0252215 A1 | 10/2011 | Franceschini et al. | |

(Continued)

OTHER PUBLICATIONS

Dell et al., "Implementing DRAM Failure Scenarios Mitigation by Using Buffer Techniques Delaying Usage of RAS Features in Computer Systems", IBM Docket No. ROC920120180US1, U.S. Appl. No. 13/693,353, filed Dec. 4, 2012.

(Continued)

*Primary Examiner* — Hiep Nguyen
(74) *Attorney, Agent, or Firm* — Peder M. Jacobson; Robert R. Williams

(57) ABSTRACT

A method and computer-readable storage media are provided for rearranging data in physical memory units. In one embodiment, a method may include monitoring utilization counters. The method may further include, comparing the utilization counters for a match with an instance in a first table containing one or more instances when data may be rearranged in the physical memory units. The table may further include where the data should be relocated by a rearrangement. The method may also include, continuing to monitor the utilization counters if a match is not found with an instance in the first table. The method may further include, rearranging the data in the physical memory units if a match between the utilization counters and an instance in the first table is found.

20 Claims, 5 Drawing Sheets

(56) References Cited

U.S. PATENT DOCUMENTS

| | | | |
|---|---|---|---|
| 2011/0289296 A1* | 11/2011 | Saito et al. | 711/209 |
| 2011/0320754 A1* | 12/2011 | Ichikawa et al. | 711/165 |
| 2012/0272039 A1* | 10/2012 | Muralimanohar et al. | 711/209 |
| 2013/0179636 A1* | 7/2013 | Shirasu et al. | 711/117 |
| 2013/0191591 A1* | 7/2013 | Kim et al. | 711/114 |
| 2013/0238832 A1* | 9/2013 | Dronamraju et al. | 711/103 |
| 2013/0268741 A1* | 10/2013 | Daly et al. | 711/165 |
| 2013/0275650 A1* | 10/2013 | Hida et al. | 711/102 |
| 2014/0189196 A1* | 7/2014 | Kelkar et al. | 711/102 |

OTHER PUBLICATIONS

IBM, "Configuring Memory Systems for Power Savings", IP.Com Prior Art Database Technical Disclosure, IP.com No. IPCOM000191777D, Published Jan. 14, 2010, pp. 1-4.

* cited by examiner

| column 1 | column 2 | column 3 | column 4 | column 5 | column 6 | column 7 | column 8 |
|---|---|---|---|---|---|---|---|
| case | Density (% of DIMM full) | | Freq. (how freq. accessed) | | Type | (% reads) | Action to Take |
| | DIMM A | DIMM B | DIMM A | DIMM B | DIMM A | DIMM B | |
| 1 | <30% | <50% | <30% | -- | >50% | -- | migrate data to DIMM B; power off DIMM A |
| 2 | <50% | <50% | <10% | <50% | -- | -- | migrate data to DIMM B; power off DIMM A |
| 3 | <50% | <30% | -- | <30% | -- | >50% | migrate data to DIMM A; power off DIMM B |
| 4 | <50% | <50% | <50% | <10% | -- | -- | migrate data to DIMM A; power off DIMM B |

MEMORY DATA MANAGEMENT

TECHNICAL FIELD

This disclosure generally relates to memory systems, and in particular, to management of data in a memory system.

BACKGROUND

Modern computer systems, such as servers, use a packaged type of volatile memory in their main memories. The main memory is the place where the computer holds current programs and data that are in use. These programs in the main memory hold the instructions that the processor executes and the data that those instructions work with. The main memory is an important part of the main processing subsystem of the computer, tied in with the processor, cache, motherboard, and chipset allowing the computer system to function.

SUMMARY

In one embodiment, a method is provided for rearranging data in physical memory units. In one embodiment, a method may include monitoring utilization counters. The method may further include, comparing the utilization counters for a match with an instance in a first table containing one or more instances when data may be rearranged in the physical memory units. The table may further include where the data should be relocated by a rearrangement. The method may also include, continuing to monitor the utilization counters if a match is not found with an instance in the first table. The method may further include, rearranging the data in the physical memory units if a match between the utilization counters and an instance in the first table is found.

In another embodiment, a computer-readable storage media is provided for rearranging data in physical memory units. In one embodiment, the computer-readable storage media may provided for monitoring utilization counters. The computer-readable storage media may further provide for, comparing the utilization counters for a match with an instance in a first table containing one or more instances when data may be rearranged in the physical memory units. The table may further include where the data should be relocated by a rearrangement. The computer-readable storage media may further provide for, monitoring utilization counters for a match with an instance in the first table. The computer-readable storage media may also provide for, continuing to monitor the utilization counters if a match is not found with an instance in the first table. The computer-readable storage media is may further provide for, rearranging the data in the physical memory units if a match between the utilization counters and an instance in the first table is found.

BRIEF DESCRIPTION OF THE DRAWINGS

Embodiments are illustrated by way of example, and not by way of limitation, in the figures of the accompanying drawings in which like reference numerals refer to similar elements or steps.

FIG. 3 is a detailed illustration of a table that may be found in block 210 of FIG. 2, according to an embodiment of the invention.

DETAILED DESCRIPTION

In many systems such as computer systems and electronic devices physical memory (herein referred to as memory) may be used to store data used by the system. This may include operating systems, application software, and information used by the systems or applications. In many systems, the memory may be composed of more than one element resulting in a plurality of physical memory units. For example, the memory may include multiple chips, modules, or cards. Systems may also use a mixture of memory types and locations. The frequency and type of information access may vary along with the type of access occurring. The access may vary even for part of a single program or application. For example, for some applications the graphical information may be loaded into memory and frequently accessed while a data table of options or preferences may also be loaded into the memory but accessed far less frequently than the graphical information. Embodiments of the presented invention may allow for the management of the location, or placement, of data loaded into memory units. The management of the location of data in memory units may allow for improved energy usage, run times, or system life.

Figure 1A:
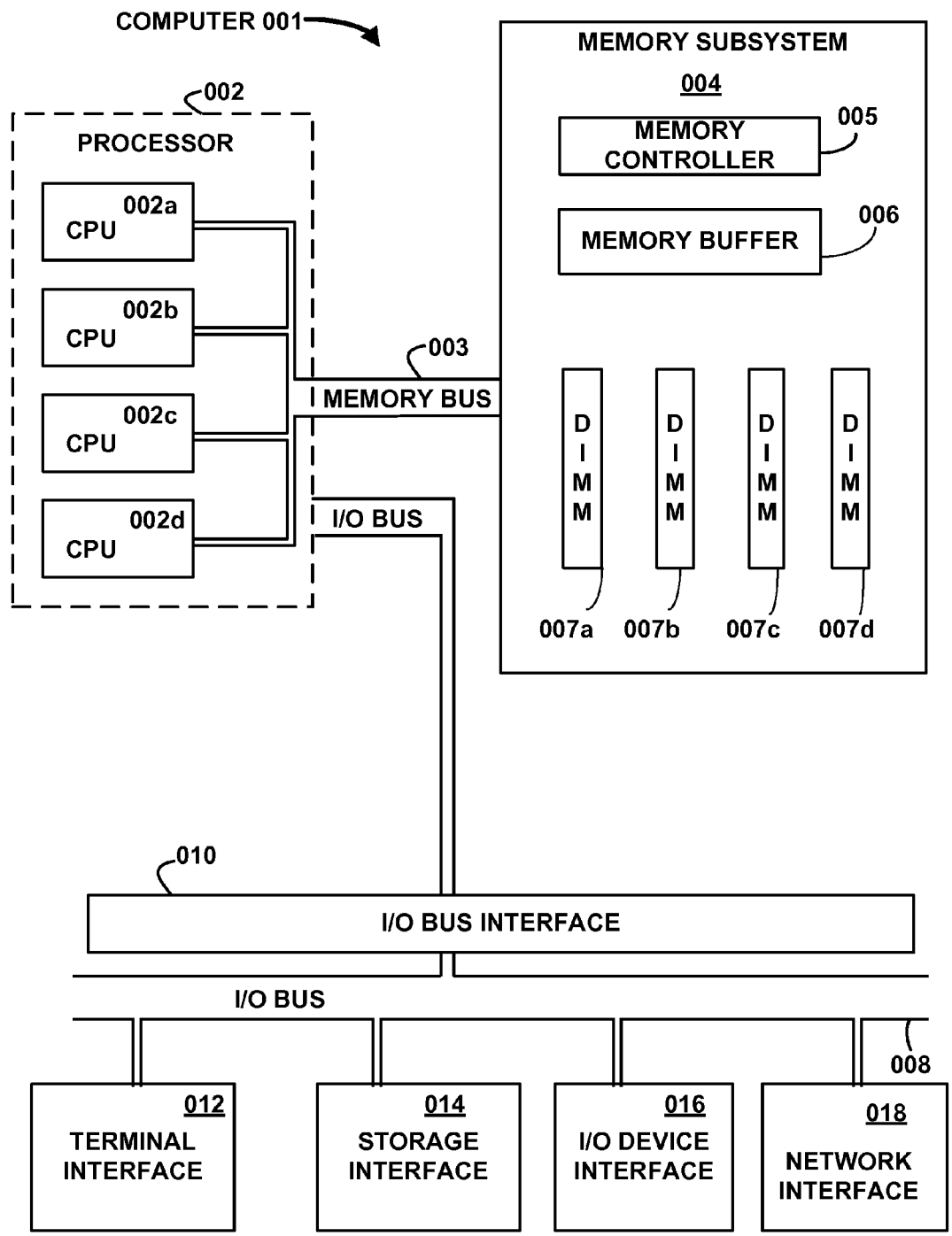
FIG. 1A depicts a high-level block diagram of an exemplary system, according to an embodiment of the invention.

FIG. 1A depicts a high-level block diagram of an exemplary system for implementing an embodiment of the invention. The mechanisms and apparatus of embodiments of the present invention apply equally to any appropriate computing system. The major components of the computer system 001 comprise one or more CPUs 002, a memory subsystem 004, a terminal interface 012, a storage interface 014, an I/O (Input/Output) device interface 016, and a network interface 018, all of which are communicatively coupled, directly or indirectly, for inter-component communication via a memory bus 003, an I/O bus 008, and an I/O bus interface unit 010.

The computer system 001 contains one or more general-purpose programmable central processing units (CPUs) 002A, 002B, 002C, and 002D, herein generically referred to as the CPU 002. In an embodiment, the computer system 001 contains multiple processors typical of a relatively large system; however, in another embodiment the computer system 001 may alternatively be a single CPU system. Each CPU 002 executes instructions stored in the memory subsystem 004 and may comprise one or more levels of on-board cache.

In an embodiment, the memory subsystem 004 may comprise a random-access semiconductor memory, storage device, or storage medium (either volatile or non-volatile) for storing data and programs. In another embodiment, the memory subsystem 004 represents the entire virtual memory of the computer system 001, and may also include the virtual memory of other computer systems coupled to the computer system 001 or connected via a network. The memory subsystem 004 is conceptually a single monolithic entity, but in other embodiments the memory subsystem 004 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory or memory subsystem 004 may contain elements for control and flow of memory used by the CPU 002. This may include all or a portion of the following: a memory controller 005, a memory buffers 006, and one or more memory units, or devices, 007a, 007b, 007c, and 007d (generically referred to as 007). In the illustrated embodiment, the memory devices may be individual or sets of dual in-line memory modules (DIMMs), which are a series of dynamic random-access memory integrated circuits mounted on a printed circuit board and designed for use in personal computers, workstations, and servers. In various embodiments, these elements may be connected with buses for communication of data and instructions. In other embodiments, these elements may be combined into single chips that perform multiple duties or integrated into various types of memory modules. The illustrated elements are shown as being contained within the memory subsystem 004 in the computer system 001, in other embodiments some or all of them may be on different computer systems and may be accessed remotely, e.g., via a network.

Although the memory bus 003 is shown in FIG. 1A as a single bus structure providing a direct communication path among the CPUs 002, the memory subsystem 004, and the I/O bus interface 010, the memory bus 003 may in fact comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 010 and the I/O bus 008 are shown as single respective units, the computer system 001 may, in fact, contain multiple I/O bus interface units 010, multiple I/O buses 008, or both. While multiple I/O interface units are shown, which separate the I/O bus 008 from various communications paths running to the various I/O devices, in other embodiments some or all of the I/O devices are connected directly to one or more system I/O buses.

In various embodiments, the computer system 001 is a multi-user mainframe computer system, a single-user system, or a server computer or similar device that has little or no direct user interface, but receives requests from other computer systems (clients). In other embodiments, the computer system 001 is implemented as a desktop computer, portable computer, laptop or notebook computer, tablet computer, pocket computer, telephone, smart phone, or any other appropriate type of electronic device.

FIG. 1A is intended to depict the representative major components of an exemplary computer system 001. But individual components may have greater complexity than represented in FIG. 1A, components other than or in addition to those shown in FIG. 1A may be present, and the number, type, and configuration of such components may vary. Several particular examples of such complexities or additional variations are disclosed herein. The particular examples disclosed are for example only and are not necessarily the only such variations.

Figure 1B:
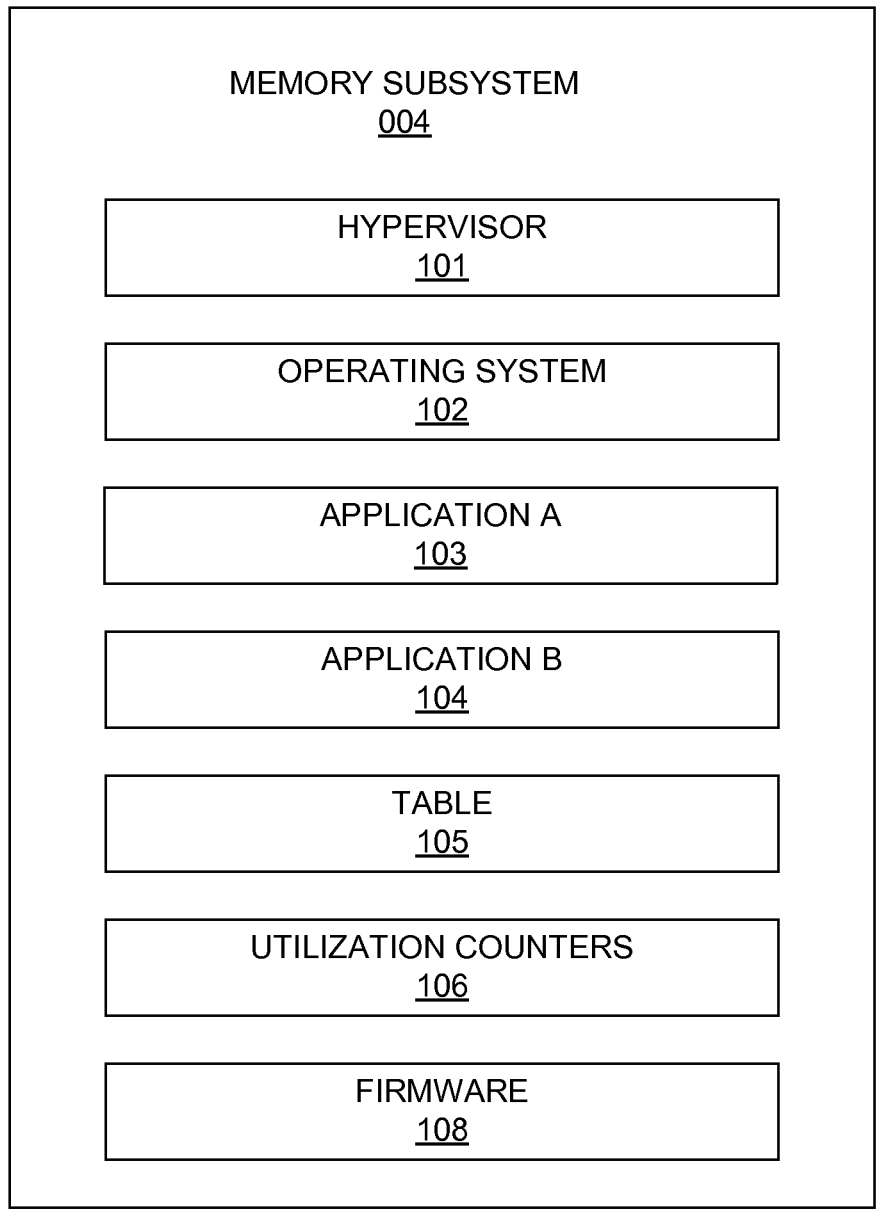
FIG. 1B is a block diagram of an example data that may reside in the memory subsystem, according to an embodiment of the invention.

FIG. 1B is a block diagram of an example data that may reside in the memory subsystem 004, according to an embodiment of the invention. With reference to the content of a memory, the term data as used herein may refer to program instructions or information that is processed using program instruction. In the illustrated embodiment, the memory subsystem 004 may contain data such as a hypervisor 101, an operating system 102, an application A 103, and application B 104, the table 105, and utilization counters 106. In alternative embodiments, the utilization counters may be implemented in hardware, such as within the memory controller 005. The memory subsystem 004 may also include firmware 108. In various embodiments, these examples of data may be more numerous or individual ones may be absent. This data may subdivided and may fully or partially reside in one or more of the elements of the memory subsystem 004 such as the memory buffer 006 or DIMMs 007a-007b. In various embodiments, the complete data for one of the example data may only be partially in the memory subsystem 004. For example, the operating system 102 may only be partially loaded into the memory subsystem 004. The operating system 102 may load additional data parts from storage using the storage interface 014, for example, as needed. In various embodiments, the hypervisor 101 or operating system 102 may be fully or partially in virtual memory. It is understood that the processor 002 deals with virtual memory addresses and the virtual memory addresses are translated through known means to access physical memory units, such as DIMMs 007a-007d. In various embodiments, the hypervisor 101 or operating system 102 may be fully or partially in the physical memory, such as DIMMs 007a-007b, of the memory subsystem 004.

Figure 2:
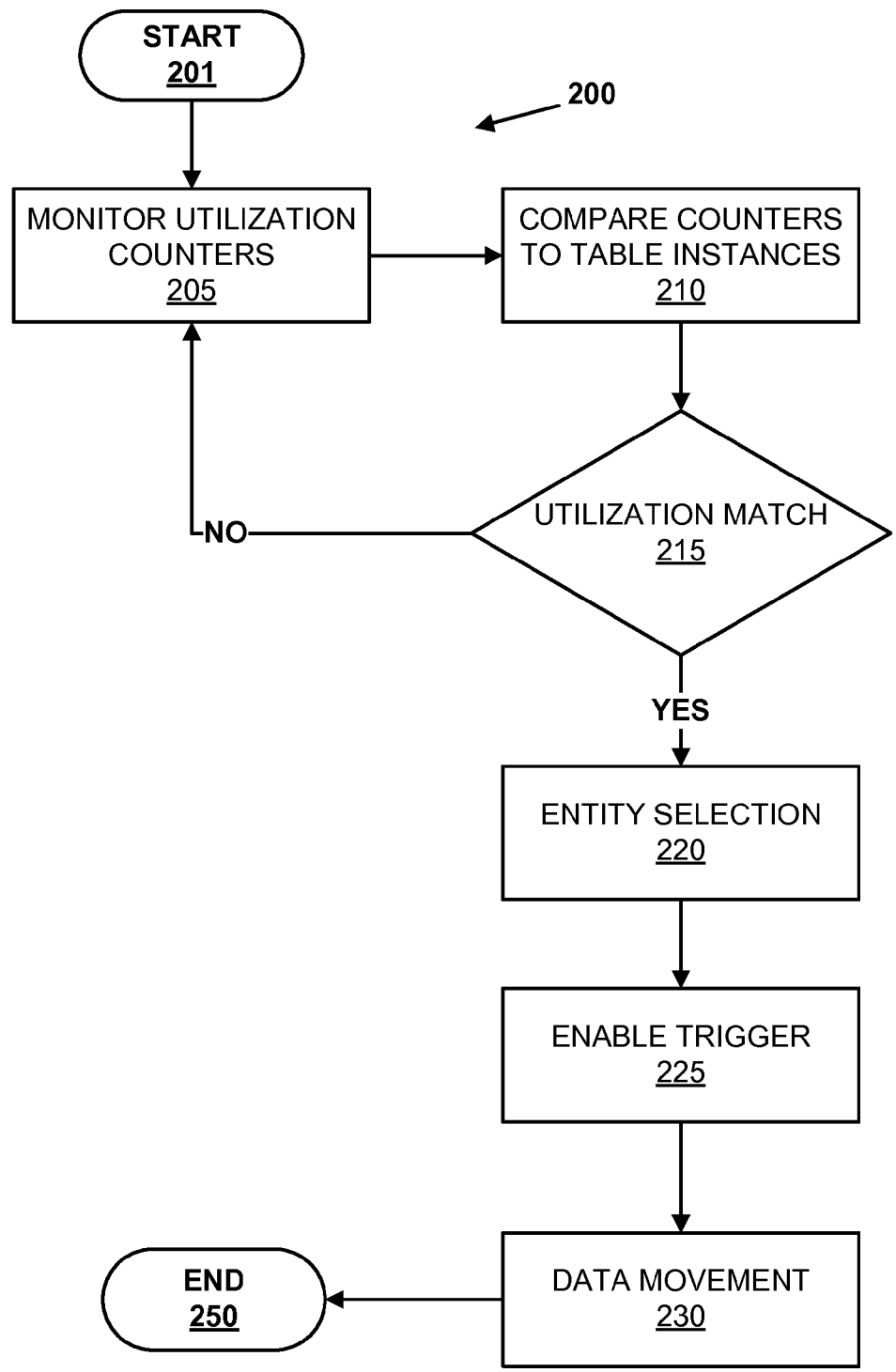
FIG. 2 is a flowchart illustrating a method 200 for managing data in memory, according to an embodiment of the invention.

FIG. 2 is a flowchart illustrating a method 200 that may be used for the management of the location, or placement, of data loaded into memory units, according to an embodiment of the invention. The method may start at block 201. In block 205, utilization counters 106 may be monitored. Counters may be used to track hot and cold pages. In an embodiment of the invention the utilization counters 106 may be used to track data density and access frequency in one or more memory units. For example, the utilization counters 106 may track data density, access frequency, and types of access for each DIMM in a group of DIMMs 007a-007d. The use of the utilization counters 106 may allow for the determination of the capability to split the data on a DIMMs 007a-007d. The use of the utilization counter 106 may also allow for the data occupancy, such as a percentage of DIMM 007 with data in it, in a particular DIMM 007 such as DIMM 007a to be identified.

In block 210, a table 105 may be accessed and compared to the utilization counters 106 being monitored in block 205. The table 105 may include one or more instances when data may be relocated. The table 105 may also include where or how data should be relocated for a specific instance. This table 105 may be located anywhere that it may be accessed by the system. This may include such locations as a hard disk drive, solid state device (SSD), or removable memory cards, optical storage, flash memory devices, network attached storage (NAS), or connections to storage area network (SAN) devices, or to a data cloud, or other devices that may store non-volatile data. A copy of the table 105 may also be stored within the memory subsystem 004 in some systems. The table 105 is discussed in greater detail below.

In block 215, a determination is made if there is a match between the use of the memory, such as DIMMS 007a-007d, according to the utilization counters 106 being monitored and an instance, or case, in the table 105. If the answer is "no" the method may proceed back to block 205 and monitor the utilization counters 106. If the answer is "yes", the method may proceed to selection of entity, such as the hypervisor 101 or operating system 102, to handle the rearrangement of data in the memory units in block 220.

In various embodiments, the determination may stop once a single match between the utilization counters 106 and an instance in the table 105 is made. In other embodiments, the method may look for multiple or all matches between the utilization counters 106 and instances on the table 105. In embodiments where more than one match may be found, the selection between multiple instances may be based upon a chosen performance metric. In various embodiments, the selection may be based off a prioritization of performance metrics built into the table 105 for the various instances. In other embodiments, the selection of performance metric may be based upon user input or settings. In other embodiments, the selection of performance metric may be based upon the programs or application that may be affected by the rearrangement of the data in the memory units. For example, the user may indicate or set a preference that the performance metric that may be used in selecting an instance should be the one with the greatest energy efficiency. In another example, a program may require that the instance that results in fastest data access be selected based off the preferred performance metric. Some examples of performance metrics may be power consumption, access speed, and load balancing. It is contemplated that other performance metrics may be used and be in the scope of the invention.

In block 220, an entity doing the rearrangement of data in the memory units may be selected. In various embodiments, an entity may be a hypervisor 101 or an operating system 102. In some embodiments where there is hypervisor manager that takes care of memory allocation it may be selected to rearrange the data in the memory units. In various embodiments, there may be determination the data in the memory units is, or may be, used by multiple operating systems or within multiple manifestations of the same Operating systems that may require the data rearrangement to be done by a hypervisor 101. In various embodiments, the memory mapping may be within the operating system 102 and the data rearrangement may be managed by operating system 102. In embodiments where the data rearrangement is managed by an operating system 102 the hypervisor 101 may have to be informed or updated.

In block 225, a trigger for the rearrangement of the data in the memory units may be initialized. In various embodiments, the operating system 102 or hypervisor 101 may poll the counters to initiate the data rearrangement. In some embodiments, interrupt methodology may be used to trigger the memory management.

In block 230, the data is rearranged. As previously discussed this may result in moving the some or all of the data from one or more memory units to one or more different memory units. In various embodiments, the rearrangement of data may be automatic. In alternate embodiments, the rearrangement of may occur incrementally. In these embodiments, the rearrangement may happen according to an on need basis, or tied to utilization, or can be periodic. The method may end in block 250.

FIG. 3 is detailed illustration of a table 105 that may be found in block 210 of FIG. 2, according to an embodiment of the invention. In the illustrated embodiment, the table 105 may enable movement of data present in DIMM 007a or DIMM 007b. The relocation or rearrangement of the data may be based off the frequency of access (columns 4 & 5) or type of access (column 6 & 7) being made of the data using the table 105. The table 105 may give rules or guidelines about the conditions for data movement to occur (columns 2 through 7). The table 105 may also give instruction on the action to take (column 8) if a case is matched. In various embodiments, the table 105 may contain guidance for cases of scarcely utilized memory configurations, where power savings are of higher priority. In other embodiments, the table 105 may base rearrangement of data on hot and cold pages, so that data movement may occur to favor performance.

In various embodiments, a multitude of tables may be available to the system. In such embodiments, the selection of the table 105 to use may be based upon user selection, program or application preferences, or operating system programming. In various embodiments, the table selection may be based upon a preferred or designated performance metric similar to the performance metric used for selecting between instances on a single table 105. Some examples of performance metrics may be power consumption, access speed, and load balancing. For example, an algorithm may select different tables to use if currently favoring performance over power. It is contemplated that, a variety of tables, parameters, performance metrics, and selection criteria may possibly be used and be within the scope of the invention.

Figure 4:
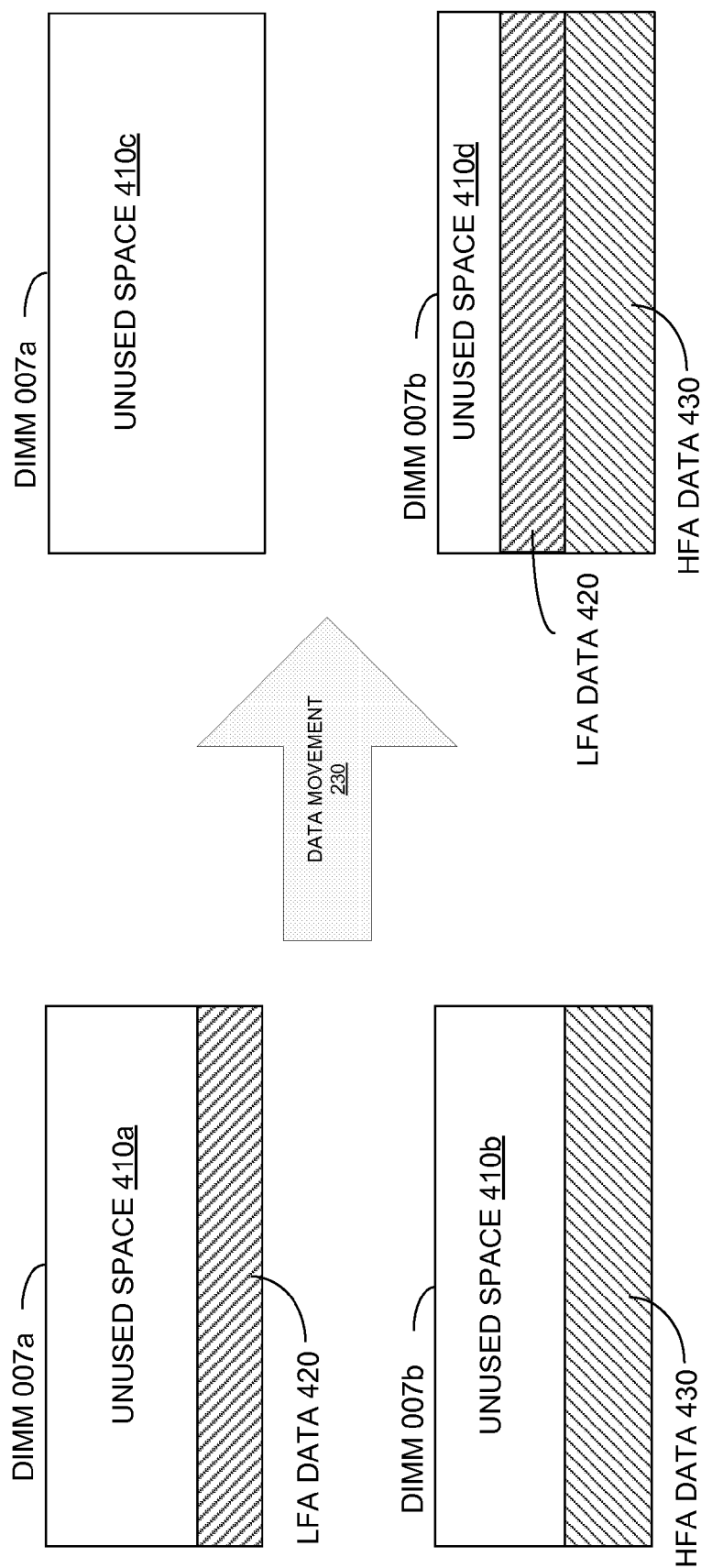
FIG. 4 is an exemplary diagram of data rearrangement, according to an embodiment of the invention.

FIG. 4 is an exemplary diagram of data rearrangement, according to an embodiment of the invention. In the illustrated embodiment, DIMM 007a and DIMM 007b are shown as being used by a system and containing data. DIMM 007a is initially shown containing low frequency accessed (LFA) data 420 with a density of less than 30% and unused space 410a. DIMM 007b is initially shown containing high frequency accessed (HFA) data 430 with a density of less than 50% and unused space 410b. In this embodiment the method 200 may be used with table 105 to determine that data may be rearranged, or moved. In this example, the LFA data may be accessed less than 30% and the access may contain greater than 50% reads. The information on the density, frequency, and type of access may be found in utilization counters 106. Using the example parameters, the data on DIMMs 007a and 007b, per the utilization counters 106, matches case "1" on table 105.

In the illustrated embodiment, data movement 230 may occur since there is match between information in the utilization counters 106 and a case on table 105. Following the data movement, DIMM 007a contains only unused space 410c. DIMM 007b now contains unused space 410d, LFA data 420, and HFA data 430. In the embodiment, DIMM 007a has had all data rearranged, or migrated, off of it and may be powered down as directed by table 105. This embodiment is for example purposes only and other embodiments may vary as previously mentioned.

Exemplary embodiments have been described in the context of a fully functional for rearranging data in physical memory units. Readers of skill in the art will recognize, however, that embodiments also may include a computer program product disposed upon computer-readable storage medium or media (or machine-readable storage medium or media) for use with any suitable data processing system or storage system. The computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer or storage system having suitable programming means will be capable of executing the steps of a method disclosed herein as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the claims.

As will be appreciated by one skilled in the art, aspects may be embodied as a system, method, or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be used. The computer readable medium may be a computer-readable signal medium or a computer-readable storage medium. The computer readable signal medium or a computer readable storage medium may be a non-transitory medium in an embodiment. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire, optical fiber cable, RF, etc., or any suitable combination of the foregoing.

Computer program code for carrying out operations for aspects may be written in any combination of one or more programming languages, including an object-oriented programming language such as Java, Smalltalk, C++ or the like and conventional procedural programming languages, such as the C programming language or similar programming languages. The program code may execute entirely on the user's computer, partly on the user's computer, as a stand-alone software package, or on one module or on two or more modules of a storage system. The program code may execute partly on a user's computer or one module and partly on a remote computer or another module, or entirely on the remote computer or server or other module. In the latter scenario, the remote computer other module may be connected to the user's computer through any type of network, including a local area network (LAN) or a wide area network (WAN), or the connection may be made to an external computer (for example, through the Internet using an Internet Service Provider).

Aspects are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function or act specified in the flowchart, or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions or acts specified in the flowchart, or block diagram block or blocks.

The flowchart and block diagrams in the Figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts, or combinations of special purpose hardware and computer instructions.

The terms "server and "mobile client" are used herein for convenience only, and in various embodiments a computer system that operates as a mobile client computer in one environment may operate as a server computer in another environment, and vice versa. The mechanisms and apparatus of embodiments of the present invention apply equally to any appropriate computing system, including a computer system that does not employ the mobile client-server model.

While this disclosure has described the details of various embodiments shown in the drawings, these details are not intended to limit the scope of the invention as claimed in the appended claims.

What is claimed is:

1. A computer implemented method for managing the use of physical memory units, comprising:

monitoring utilization counters;
comparing the utilization counters for a match with an instance in a first table containing one or more instances when data may be rearranged in the physical memory units and where the data should be relocated by a rearrangement;
continuing to monitor the utilization counters if a match is not found with an instance in the first table; and
rearranging the data in the physical memory units if a match between the utilization counters and an instance in the first table is found.

2. The method of claim 1, the rearrangement of data in the memory further comprising:
selecting an entity to rearrange the data;
rearranging the data in the physical memory units by the entity.

3. The method of claim 2, wherein the entity is a hypervisor.

4. The method of claim 2, wherein the entity is an operating system.

5. The method of claim 1, further comprising:
rearranging the data in physical memory units to modify a performance metric.

6. The method of claim 5, wherein the performance metric is power consumption.

7. The method of claim 5, wherein the performance metric is access speed.

8. The method of claim 5, wherein the performance metric is load balancing.

9. The method of claim 1, further comprising:
selecting the first table from a plurality of tables based upon a goal criteria.

10. The method of claim 1, wherein the physical memory units are a first and a second DIMM.

11. A computer-readable storage medium having executable code stored thereon to cause a machine to rearranging data in physical memory units, comprising:
monitoring utilization counters;
comparing the utilization counters for a match with an instance in a first table containing one or more instances when data may be rearranged in the physical memory units and where the data should be relocated by a rearrangement;
continuing to monitor the utilization counters if a match is not found with an instance in the first table; and
rearranging the data in the physical memory units if a match between the utilization counters and an instance in the first table is found.

12. The computer-readable storage medium of claim 11, the rearrangement of data in the physical memory units further comprising:
selecting an entity to rearrange the data;
rearranging the data in the physical memory units by the entity.

13. The computer-readable storage medium of claim 12, wherein the entity is a hypervisor.

14. The computer-readable storage medium of claim 12, wherein the entity is an operating system.

15. The computer-readable storage medium of claim 11, further comprising:
rearranging the data in the physical memory units to modify a performance metric.

16. The computer-readable storage medium of claim 15, wherein the performance metric is power consumption.

17. The computer-readable storage medium of claim 15, wherein the performance metric is access speed.

18. The computer-readable storage medium of claim 15, wherein the performance metric is load balancing.

19. The computer-readable storage medium of claim 11, further comprising:
selecting the first table from a plurality of tables based upon a goal criteria.

20. The computer-readable storage medium of claim 11, wherein the physical memory units are a first and a second DIMM.

* * * * *